(12) United States Patent
Yasuhara et al.

(10) Patent No.: US 11,889,776 B2
(45) Date of Patent: Jan. 30, 2024

(54) VARIABLE RESISTANCE NON-VOLATILE MEMORY ELEMENT AND VARIABLE RESISTANCE NON-VOLATILE MEMORY DEVICE USING THE ELEMENT

(71) Applicant: Nuvoton Technology Corporation Japan, Kyoto (JP)

(72) Inventors: Ryutaro Yasuhara, Hyogo (JP); Satoru Fujii, Osaka (JP); Takumi Mikawa, Shiga (JP); Atsushi Himeno, Osaka (JP); Kengo Nishio, Ibaraki (JP); Takehide Miyazaki, Ibaraki (JP); Hiroyuki Akinaga, Ibaraki (JP); Yasuhisa Naitoh, Ibaraki (JP); Hisashi Shima, Ibaraki (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 331 days.

(21) Appl. No.: 17/356,029

(22) Filed: Jun. 23, 2021

(65) Prior Publication Data

US 2021/0320248 A1    Oct. 14, 2021

Related U.S. Application Data

(63) Continuation of application No. PCT/JP2019/030901, filed on Aug. 6, 2019.

(30) Foreign Application Priority Data

Dec. 26, 2018  (JP) .................. 2018-241986

(51) Int. Cl.
*H10N 70/00* (2023.01)
*H10B 63/00* (2023.01)
*H10N 70/20* (2023.01)

(52) U.S. Cl.
CPC .......... *H10N 70/828* (2023.02); *H10B 63/20* (2023.02); *H10B 63/30* (2023.02); *H10N 70/24* (2023.02)

(58) Field of Classification Search
CPC ...... H10N 70/828; H10N 70/24; H10B 63/20; H10B 63/30
See application file for complete search history.

(56) References Cited

U.S. PATENT DOCUMENTS 6,204,139 B1  3/2001  Liu et al.
8,288,297 B1  10/2012  Wang et al.
(Continued)

FOREIGN PATENT DOCUMENTS

JP  2004-363604 A  12/2004
JP  2006-005313 A  1/2006
(Continued)

OTHER PUBLICATIONS

Aluminum oxide, Wikipedia, archived Dec. 3, 2017 (Year: 2017).*
(Continued)

*Primary Examiner* — Shih Tsun A Chou
(74) *Attorney, Agent, or Firm* — Rimon P.C.

(57) ABSTRACT

A variable resistance non-volatile memory element includes first and second electrodes and a variable resistance layer between the electrodes. The layer has a resistance value reversibly variable based on an electrical signal. The layer includes a first variable resistance layer that includes an oxygen deficient first metal oxide containing a first metal element and oxygen, and a second variable resistance layer that includes a composite oxide containing the first metal element, a second metal element different from the first metal element, and oxygen, and having a different degree of oxygen deficiency from the first metal oxide. The composite oxide has a lower degree of oxygen deficiency than the first
(Continued)

metal oxide. At room temperature, the composite oxide has a smaller oxygen diffusion coefficient than a second metal oxide containing the first metal element and oxygen, and having the degree of oxygen deficiency equal to that of the composite oxide.

19 Claims, 8 Drawing Sheets

(56) References Cited

U.S. PATENT DOCUMENTS

| | | |
|---|---|---|
| 2004/0245557 A1 | 12/2004 | Seo et al. |
| 2005/0280069 A1 | 12/2005 | Mizushima et al. |
| 2006/0126423 A1 | 6/2006 | Aratani et al. |
| 2009/0283736 A1 | 11/2009 | Kanzawa et al. |
| 2011/0031459 A1 | 2/2011 | Kubo et al. |
| 2013/0056702 A1* | 3/2013 | Wang ............... H01L 21/02194 257/E45.001 |
| 2013/0082230 A1 | 4/2013 | Katayama et al. |
| 2013/0295745 A1 | 11/2013 | Takahashi et al. |
| 2013/0314969 A1* | 11/2013 | Kouno ............... G11C 13/0023 365/65 |
| 2015/0171324 A1* | 6/2015 | Mikawa ............... H10N 70/801 257/4 |
| 2020/0158796 A1* | 5/2020 | Ikhtiar ............... H10N 50/10 |

FOREIGN PATENT DOCUMENTS

| | | |
|---|---|---|
| JP | 2006-173267 A | 6/2006 |
| JP | 2014-531749 A | 11/2014 |
| WO | 2008/149484 A1 | 12/2008 |
| WO | 2009/122568 A1 | 10/2009 |
| WO | 2012/042897 A1 | 4/2012 |
| WO | 2012/120893 A1 | 9/2012 |
| WO | 2013/108593 A1 | 7/2013 |

OTHER PUBLICATIONS

Tantalum pentoxide, Wikipedia, archived Sep. 7, 2017 (Year: 2017).*
International Search Report issued in corresponding International Patent Application No. PCT/JP2019/030901, dated Oct. 21, 2019, with English translation.

* cited by examiner

VARIABLE RESISTANCE NON-VOLATILE MEMORY ELEMENT AND VARIABLE RESISTANCE NON-VOLATILE MEMORY DEVICE USING THE ELEMENT

CROSS REFERENCE TO RELATED APPLICATIONS

This is a continuation application of PCT International Application No. PCT/JP2019/030901 filed on Aug. 6, 2019, designating the United States of America, which is based on and claims priority of Japanese Patent Application No. 2018-241986 filed on Dec. 26, 2018. The entire disclosures of the above-identified applications, including the specifications, drawings and claims are incorporated herein by reference in their entirety.

FIELD

The present disclosure relates to a variable resistance non-volatile memory element whose resistance value varies in accordance with applied electrical signals, and a variable resistance non-volatile memory device using the element.

BACKGROUND

In recent years, with developing digital techniques, the functions of electronic devices such as mobile information devices and information appliances have further increased. With higher functions of these electronic devices, semiconductor elements for use have rapidly decreased in size and increased in speed. Among them, applications of high-capacity non-volatile memories represented by flash memories have rapidly increased.

As new next generation non-volatile memories replacing these flash memories, variable resistance non-volatile memory devices using what are called "variable resistance elements" are increasingly researched and developed. The "variable resistance elements" have, as a feature, resistance values reversibly changed by electrical signals, and storing the information corresponding to these resistance values in a non-volatile manner (see, e.g., Patent Literature (PTL) 1).

As a related art technique, operating such a non-volatile variable resistance element including a transition metal oxide is suggested. Examples of the transition metal oxide include perovskite materials such as $Pr_{(1-x)}Ca_xMnO_3$ [PCMO], $LaSrMnO_3$ [LSMO], and $GdBaCo_xO_y$ [GBCO] as well as nickel oxide (NiO), vanadium dioxide ($V_2O$), zinc oxide (ZnO), niobium pentoxide ($Nb_2O_5$), titanium dioxide ($TiO_2$), tungsten oxide ($WO_3$), and cobalt oxide (CoO). According to this technique, voltage pulses that are voltages in short-duration waves are applied to an oxide material to increase or decrease its resistance value, and the changed resistance value is associated with data to be stored (see, e.g., PTL 2).

CITATION LIST

Patent Literature

PTL 1: Japanese Unexamined Patent Application Publication No. 2004-363604
PTL 2: U.S. Pat. No. 6,204,139

SUMMARY

Technical Problem

A further increase in the capacities of non-volatile memories is expected in the future. Accordingly, a decrease in the operating power or operating currents of non-volatile memory elements is required. It is, however, generally known that the data retention properties of non-volatile memory elements including variable resistance elements deteriorate with a decrease in the operating currents. The "data retention properties" here represent how long the information stored in a non-volatile memory element remains stably with the power off. The properties represent the term "non-volatile" and thus one of most important properties of non-volatile memories.

The present disclosure was made in view of the circumstances. It is a main objective of the present disclosure to provide a variable resistance non-volatile memory element storing information stably for a long term, and a variable resistance non-volatile memory device using the element.

Solutions to Problem

In order to achieve the objective, a variable resistance non-volatile memory element according to the present disclosure includes: a first electrode; a second electrode; and a variable resistance layer between the first electrode and the second electrode, the variable resistance layer having a resistance value reversibly variable based on an electrical signal applied between the first electrode and the second electrode. The variable resistance layer includes: a first variable resistance layer that includes a first metal oxide of an oxygen-deficient type, the first metal oxide containing a first metal element and oxygen; and a second variable resistance layer that includes a composite oxide containing the first metal element, a second metal element different from the first metal element, and oxygen, and having a degree of oxygen deficiency different from a degree of oxygen deficiency of the first metal oxide. The degree of oxygen deficiency of the composite oxide is lower than the degree of oxygen deficiency of the first metal oxide. The composite oxide has, at room temperature, an oxygen diffusion coefficient smaller than an oxygen diffusion coefficient, at the room temperature, of a second metal oxide containing the first metal element and oxygen, and having a degree of oxygen deficiency equal to the degree of oxygen deficiency of the composite oxide.

A variable resistance non-volatile memory device according to the present disclosure includes: a memory cell array on or above a substrate; and a voltage application circuit. The memory cell array includes, in a matrix, a plurality of variable resistance non-volatile memory elements, each being the variable resistance non-volatile memory element described above. The voltage application circuit writes, erases, and reads out data in and from a predetermined one of the plurality of variable resistance non-volatile memory elements.

Advantageous Effects

The variable resistance non-volatile memory element and the variable resistance non-volatile memory device using the element according to the present disclosure stably store information for a long term.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Now, embodiments of the present disclosure will be described with reference to the drawings. Note that the embodiments described below are mere specific examples of the present disclosure. The numerical values, shapes, materials, constituent elements, the arrangement and connection of the constituent elements, steps, step orders etc. shown in the following embodiments are thus mere examples, and are not intended to limit the scope of the present disclosure. The present disclosure is limited only by the claims.

Among the constituent elements in the following embodiments, those not recited in any of the independent claims defining the broadest concept of the present disclosure are described as those not necessarily required to achieve the objective of the present disclosure but applicable.

After earnest studies for extending the data retention periods of variable resistance non-volatile memory elements, the present inventors have obtained a variable resistance non-volatile memory element with improved data retention properties as compared to related art. For the sake of simplicity, a "variable resistance non-volatile memory element" will be hereinafter simply referred to as a "variable resistance element".

The variable resistance element includes a first electrode, a second electrode, and a variable resistance layer of a metal oxide between the first electrode and the second electrode. The resistance value of the variable resistance layer reversibly varies based on electrical signals applied between the electrodes. The variable resistance layer has a multilayer structure of a first variable resistance layer and a second variable resistance layer. The first variable resistance layer includes a first metal element and oxygen. The second variable resistance layer includes, in addition, a second metal element. The second metal element may be a material that contributes to a decrease in the oxygen diffusion coefficient of the second variable resistance layer. As a result, a variable resistance element is provided which has improved data retention properties as compared to the related art.

Details of the variable resistance element will be described as appropriate with reference to embodiments.

Embodiment 1

Structure of Variable Resistance Element

First, an example structure of a variable resistance element according to Embodiment 1 will be described while being compared with the structure of a variable resistance element according to related art.

Figure 1A:
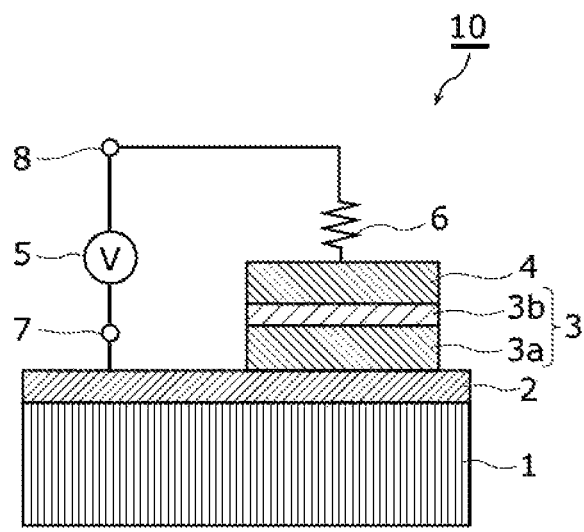
FIG. 1A is a schematic view showing an example configuration of a variable resistance element according to related art.

FIG. 1A is a schematic view showing an example structure of the variable resistance element according to the related art.

Figure 1B:
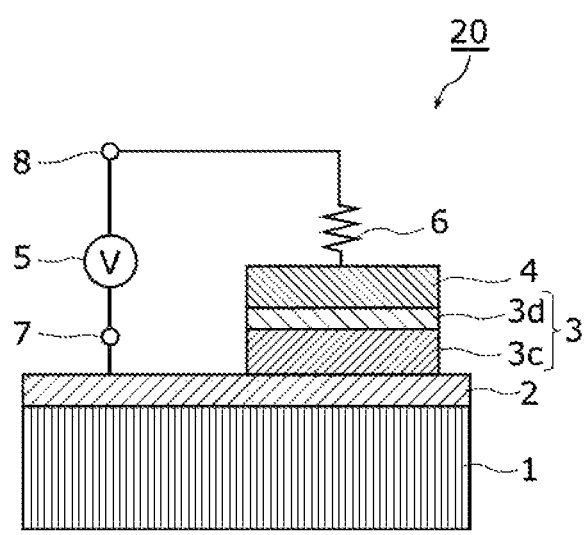
FIG. 1B is a schematic view showing an example configuration of a variable resistance element according to Embodiment 1.

FIG. 1B is a schematic view showing an example configuration of the variable resistance element according to Embodiment 1.

As shown in FIGS. 1A and 1B, each of variable resistance element 10 according to the related art and variable resistance element 20 according to this embodiment includes substrate 1, first electrode 2 on substrate 1, variable resistance layer 3 on first electrode 2, and second electrode 4 on variable resistance layer 3. Here, first electrode 2 and second electrode 4 are electrically connected to variable resistance layer 3.

Note that first electrode 2 may be in the same as or a different size from second electrode 4. The positions of first electrode 2, second electrode 4, and variable resistance layer 3 may be vertically inverted or may be arranged horizontally.

Substrate 1 is, for example, a silicon substrate including circuit elements such as transistors. Each of first electrode 2 and second electrode 4 includes, for example, one or more materials of gold (Au), platinum (Pt), iridium (Ir), Copper (Cu), tungsten (W), tantalum nitride (TaN), and titanium nitride (TiN).

In variable resistance element 10, variable resistance layer 3 includes a metal oxide. Variable resistance layer 3 of variable resistance element 10 has a multilayer structure obtained by stacking first tantalum oxide layer 3a as a first variable resistance layer and second tantalum oxide layer 3b as a second variable resistance layer, for example. Second tantalum oxide layer 3b has an oxygen content higher than that of first tantalum oxide layer 3a.

Here, the "oxygen content" is the percentage of the number of contained oxygen atoms with respect to the total number of atoms forming a metal oxide. For example, the oxygen content of $Ta_2O_5$ is the percentage of oxygen atoms with respect to the total number of atoms (i.e., $O/(Ta+O)$) and is thus 71.4 atm %. Accordingly, the oxygen deficient tantalum oxide has an oxygen content higher than 0 and lower than 71.4 atm %.

For example, if the metal of the first metal oxide layer is of the same type as the metal of the second metal oxide layer, the oxygen content corresponds to the degree of oxygen deficiency. Specifically, if the second metal oxide has an oxygen content higher than that of the first metal oxide, the second metal oxide has a degree of oxygen deficiency lower than that of the first metal oxide.

The "degree of oxygen deficiency" is the rate of deficient oxygen with respect to the amount of oxygen in a metal oxide with the stoichiometric composition. If there are a plurality of metal oxides with the stoichiometric compositions, the composition of the oxide with the highest resistance value is defined as the stoichiometric composition.

Accordingly, the metal oxide with the stoichiometric composition defined as described above is more stable and has a resistance value higher than those of the metal oxides with the other compositions.

For example, if metal is tantalum (Ta), its oxide has the stoichiometric composition $Ta_2O_5$ which can be represented by $TaO_{2.5}$. The degree of oxygen deficiency of $TaO_{2.5}$ is 0%. The degree of oxygen deficiency of $TaO_{1.5}$ is obtained as follows.

$$\text{Degree of Oxygen deficiency} = (2.5-1.5)/2.5 = 40\%$$

On the other hand, the degree of oxygen deficiency of an oxygen excessive metal oxide has a minus value. Unless otherwise noted, degrees of oxygen deficiency will be described in this specification including zero as well as positive and negative values.

An oxide with a lower degree of oxygen deficiency is similar to the oxide with the stoichiometric composition and thus has a higher resistivity, whereas an oxide with a higher degree of oxygen deficiency is similar to metal forming the oxide and thus has a lower resistivity.

An "oxygen deficient metal oxide" has an oxygen content (i.e., percentage of atoms: the percentage of the number of oxygen atoms with respect to the total number of atoms) lower than that of the metal oxide with the stoichiometric composition.

The "metal oxide with the stoichiometric composition" has a degree of oxygen deficiency of 0%. For example, in the case of a tantalum oxide, an insulator $Ta_2O_5$ is the metal oxide with the stoichiometric composition.

By contrast, an oxygen deficient metal oxide is conductive.

On the other hand, in variable resistance element 20, variable resistance layer 3 is obtained by stacking tantalum oxide layer 3c as a first variable resistance layer and composite oxide layer 3d as a second variable resistance layer. Tantalum oxide layer 3c includes an oxygen deficient tantalum oxide containing Ta and oxygen (O), whereas composite oxide layer 3d includes an oxygen deficient oxide containing Ta, an additional metal element different from Ta, and O. Composite oxide layer 3d has a degree of oxygen deficiency lower than that of tantalum oxide layer 3c.

Here, Ta is an example of the "first metal element", and the tantalum oxide of tantalum oxide layer 3c is an example of the "first metal oxide". On the other hand, the additional metal element is an example of the "second metal element", and the oxide of composite oxide layer 3d containing Ta and the additional metal element is an example of the "composite oxide".

Since the stoichiometric composition of the composite oxide depends on the type of the additional metal element, the degree of oxygen deficiency universally represents the magnitude of the amount of deficient oxygen in the oxide as compared to the oxygen content. Accordingly, in this specification, the degree of oxygen deficiency is used for studying the magnitude of the amount of deficient oxygen particularly in a composite oxide.

With respect to variable resistance element 10, the expression $0<x<2.5$ may be satisfied, where the tantalum oxide of first tantalum oxide layer 3a has a composition $TaO_x$. In addition, the expression $x<y$ may be satisfied, where the tantalum oxide of second tantalum oxide layer 3b has a composition $TaO_y$. In particular, where $0.8 \leq x \leq 1.9$ and $2.1 \leq y \leq 2.5$, the resistance value of variable resistance layer 3 is stably variable at a high speed.

Expressed by the degree of oxygen deficiency, the expressions $0\% < p < 100\%$ and $p > q$ may be satisfied, where the tantalum oxide of first tantalum oxide layer 3a has degree p of oxygen deficiency and the tantalum oxide of second tantalum oxide layer 3b has degree q of oxygen deficiency. In particular, where $24\% \leq p \leq 68\%$ and $0 \leq q \leq 16\%$, the resistance value of variable resistance layer 3 is stably variable at a high speed.

Similarly, with respect to variable resistance element 20, the expressions $0\% < r < 100\%$ and $r > s$ may be satisfied, where the tantalum oxide of tantalum oxide layer 3c has degree r of oxygen deficiency and the composite oxide of composite oxide layer 3d has degree s of oxygen deficiency. In particular, r and s may fall within the ranges $24\% \leq r \leq 68\%$ and $0 \leq s \leq 16\%$, respectively.

The degree of oxygen deficiency and composition of a composite oxide are associated as follows. For example, assume that composite oxide layer 3d includes a composite oxide containing Ta, aluminum (Al) as an additional metal element, and O, and that the elemental ratio of Ta and Al is 1:1. In this case, the tantalum oxide and the aluminum oxide have the stoichiometric compositions $Ta_2O_5$ and $Al_2O_3$, respectively. Where s is 0%, the composite oxide has the composition $TaAlO_4$, that is, the stoichiometric composition. Where s is 10%, the composite oxide has the composition $TaAlO_{3.6}$.

A variation in the resistance value is acknowledged, where variable resistance layer 3 has a thickness of 1 μm or less. The thickness may be however 40 nm or less. With a thickness of 40 nm or less, variable resistance layer 3 is easily processed in photolithography and etching as a patterning process. In addition, a voltage pulse only needs a lower voltage to change the resistance value of variable resistance layer 3. On the other hand, in view of reliably reducing the breakdown, that is, dielectric breakdown at the time of applying a voltage pulse, variable resistance layer 3 may have a thickness of at least 5 nm or more.

Composite oxide layer 3d may have a thickness ranging from about 1 nm to about 8 nm in view of reducing a possible excessive increase in the initial resistance value and obtaining a stably variable resistance.

Referring back to FIG. 1B, in order to operate variable resistance element 20, first electrode 2 and second electrode 4 are electrically connected to different terminals of power source 5 via terminals 7 and 8, respectively. Here, variable resistance element may be electrically connected to power source 5 via protective resistor 6.

Power source 5 is configured, as an electrical pulse application device for driving variable resistance element 20, to apply voltage pulses to variable resistance element 20. The voltage pulses are electrical pulses with predetermined polarities, voltages, and durations. The voltage pulses are applied between first and second terminals 7 and 8.

Note that protective resistor 6 is for reducing breakage of the variable resistance element due to overcurrent, and may have a resistance value of 4.5 kΩ, for example, in this embodiment.

In the following description, the voltage of the voltage pulse applied between the electrodes of variable resistance element 20 is specified by the potential of second terminal 8 relative to first terminal 7. If a positive voltage is applied to second terminal 8, the current has a positive polarity.

Manufacturing Method of Variable Resistance Element

Now, an example manufacturing method of variable resistance element 20 shown in FIG. 2 will be described. Here, the example will be described where composite oxide layer 3*d* includes a composite oxide containing Ta, Al, and O.

Figure 2:
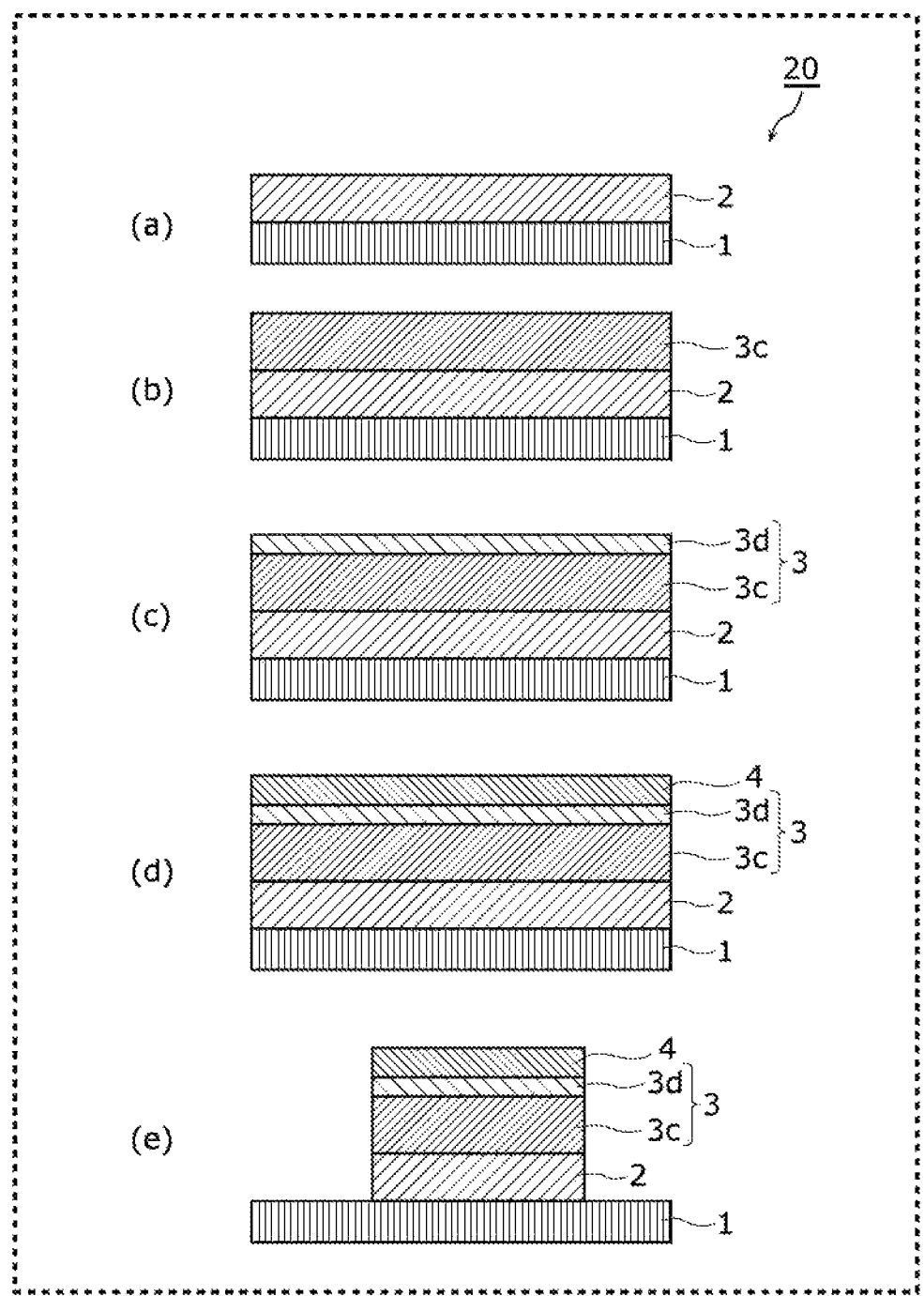
In FIG. 2, (a) to (e) are cross-sectional views showing example steps of a manufacturing method of the variable resistance element according to Embodiment 1.

First, as shown in (a) of FIG. 2, first electrode 2 of tantalum nitride with a thickness of 20 nm is formed on substrate 1 by sputtering, for example.

Next, as shown in (b) of FIG. 2, tantalum oxide layer 3*c* is formed on first electrode 2 by what is called "reactive sputtering" of sputtering, for example, a metal tantalum target in argon gas and oxygen gas. Here, the degree of oxygen deficiency of tantalum oxide layer 3*c* is easily adjusted by changing the flow ratio of the oxygen gas to the argon gas. The substrate is not particularly heated and may be kept at room temperature.

Then, as shown in (c) of FIG. 2, composite oxide layer 3*d* with a lower degree of oxygen deficiency is formed, for example, by sputtering using a tantalum oxide (e.g., $Ta_2O_5$) target with a high oxygen content and an aluminum oxide (e.g., $Al_2O_3$) target with a high oxygen content. Accordingly, composite oxide layer 3*d* with a degree of oxygen deficiency lower than that of tantalum oxide layer 3*c* is formed on the surface of tantalum oxide layer 3*c* formed earlier.

In this manner, variable resistance layer 3 is formed by sputtering through simultaneous discharge using the tantalum oxide target and the aluminum oxide target. The formation is not limited to this example. Variable resistance layer 3 may be formed by sputtering in an alternating multilayer through alternating discharge using the tantalum oxide target and the aluminum oxide target. Variable resistance layer 3 may be formed by reactive sputtering under an oxygen gas atmosphere using the metal tantalum target and a metal aluminum target.

Here, oxygen deficient tantalum oxide layer 3*c* and composite oxide layer 3*d* correspond to the first variable resistance layer and the second variable resistance layer, respectively. Oxygen deficient tantalum oxide layer 3*c* and composite oxide layer 3*d* formed in the manner described above constitute variable resistance layer 3. While oxygen deficient tantalum oxide layer 3*c* and composite oxide layer 3*d* are amorphous in this embodiment, one or both of oxygen deficient tantalum oxide layer 3*c* and composite oxide layer 3*d* may be crystalline.

After that, as shown in (d) of FIG. 2, second electrode 4 of Ir with a thickness of 5 nm is formed on variable resistance layer 3 formed in (c) of FIG. 2, by sputtering, for example. As a result, a multilayer structure of variable resistance element 20 is obtained. In this embodiment, second electrode 4 includes Ir. Alternatively, the second electrode may include noble metal such as Pt, palladium (Pd), or ruthenium (Ru), or metal nitride such as TiN or TaN.

In the end, as shown in (e) of FIG. 2, in order to form variable resistance element 20, first electrode 2, oxygen deficient tantalum oxide layer 3*c*, composite oxide layer 3*d*, and second electrode 4 are patterned using a desired mask. Accordingly, variable resistance element 20 is formed which includes variable resistance layer 3 with the multilayer structure of oxygen deficient tantalum oxide layer 3*c* and composite oxide layer 3*d*, between first electrode 2 and second electrode 4.

In order to form variable resistance element 20, first electrode 2, tantalum oxide layer 3*c*, composite oxide layer 3*d*, and second electrode 4 may be collectively patterned using a single mask or each layer may be patterned using an individual mask.

Note that the sizes and shapes of first electrode 2 and second electrode 4 as well as variable resistance layer 3 can be adjusted by the photomask(s) and photolithography.

In this embodiment, second electrode 4 and variable resistance layer 3 have a size of 0.1 μm×0.1 μm (i.e., an area of 0.01 μm$^2$). The contact between first electrode 2 and variable resistance layer 3 also has the size of 0.1 μm×0.1 μm (i.e., the area of 0.01 μm$^2$). The size and shape are mere examples and may be changed as appropriate depending on the layout design.

In this embodiment, as an example, degree r of oxygen deficiency of oxygen deficient tantalum oxide layer 3*c* is 38%, whereas degree s of oxygen deficiency of composite oxide layer 3*d* is around 1%. In addition, variable resistance layer 3 has a thickness of 24 nm, tantalum oxide layer 3*c* has a thickness of about 20 nm, and composite oxide layer 3*d* has a thickness of about 4 nm.

While r is 38% and s is 1% in this embodiment, the values of r and s are not limited to this example. As described above, for example, even if r and s vary within the ranges 24%≤r≤68% and 0≤s≤16%, respectively, a stably variable resistance is achieved like the variable resistance properties in this embodiment.

Operation of Variable Resistance Element

Now, an operation of variable resistance element 20 obtained by the manufacturing method described above will be described with reference to FIG. 1B.

In the following description, variable resistance layer 3 has a predetermined high resistance value (e.g., 300 kΩ) in a "high-resistance state". Similarly, variable resistance layer 3 has a predetermined low resistance value (e.g., 12 kΩ) in a "low-resistance state".

Using power source 5 shown in FIG. 1B, a write voltage pulse, which is a voltage pulse with the negative polarity, is applied between first and second terminals 7 and 8. Then, the resistance value of variable resistance layer 3 decreases, whereby variable resistance layer 3 changes from the high-resistance state to the low-resistance state. This process will be referred to as a "write process".

On the other hand, an erase voltage pulse, which is a voltage pulse with the positive polarity, is applied between first and second terminals 7 and 8. Then, the resistance value of variable resistance layer 3 increases, whereby variable resistance layer 3 changes from the low-resistance state to the high-resistance state. This process will be referred to as an "erase process".

At a "voltage pulse with the positive polarity", second terminal 8 has a positive voltage relative to first terminal 7. At a "voltage pulse with the negative polarity", first terminal 7 has a positive voltage relative to second terminal 8.

Such write and erase processes are repeated, whereby variable resistance element 20 operates as a non-volatile memory element.

Here, an initial process will be described. In this embodiment, the initial process is executed before the first write process. The initial process is a preparation process for achieving a stable resistance changing operation in the subsequent write and erase processes.

In general, variable resistance element 20 immediately after the manufacture has a further higher initial resistance value than in the high-resistance state while the resistance varies normally. Even if a write voltage pulse or an erase voltage pulse for a normal operation is applied in this state, the resistance does not vary.

To address the problem, in the initial process, two types of first and second initial voltage pulses are applied in this order between first and second terminals 7 and 8. The first initial voltage pulse (i.e., a high-resistance breakdown voltage pulse) has the positive polarity, whereas the second initial voltage pulse (i.e., a low-resistance breakdown voltage pulse) has the negative polarity.

When the first initial voltage pulse is applied, the resistance value of variable resistance layer 3 decreases from the initial resistance value to a first resistance value. Next, when the second initial voltage pulse is applied, the resistance value of variable resistance layer 3 further decreases from the first resistance value to a second resistance value.

Subsequently, a write voltage pulse or an erase voltage pulse for the normal operation is applied, whereby variable resistance element 20 has a repeatedly variable voltage between the high- and low-resistance states.

In short, the initial process is performed for variable resistance element 20 not yet applied with any voltage in an initial state immediately after the manufacture.

Note that the first initial voltage pulse with the positive polarity and the second initial voltage pulse with the negative polarity are used in the initial process. Any one of the polarities of the first and second initial voltage pulses may be used to decrease the resistance value of variable resistance layer 3 from the initial resistance value to resistance value in the normal operation.

Through the initial process described above, a local area called "filament" with a degree of oxygen deficiency higher than those of the surroundings is formed within variable resistance layer 3. In the calculation of the diffusion coefficient by computer simulation, which will be described later, the filament has a degree of oxygen deficiency of 20% based on the past analysis results.

In a normal resistance changing operation after the initial process, a write voltage pulse with the negative polarity is applied between first and second terminals 7 and 8, whereby the resistance state changes from the high-resistance state to the low-resistance state. On the other hand, an erase voltage pulse with the positive polarity is applied between first and second terminals 7 and 8, whereby the resistance state changes from the low-resistance state to the high-resistance state.

The mechanism of the resistance changing operation at this time may be attributed to the degree of oxygen deficiency within the filament increased by a write voltage pulse and decreased by an erase voltage pulse. Here, the relation NHVO<NLVO is satisfied, where the degrees of oxygen deficiency within the filament in the high- and low-resistance states in the resistance changing operation are NHVO and NLVO, respectively.

While the filament is formed through the initial process in this embodiment, the filament is not necessarily formed through the initial process. For example, a composite oxide layer with a degree of oxygen deficiency sufficiently higher than 0% may be provided in place of the filament in forming the variable resistance element.

Figure 3:
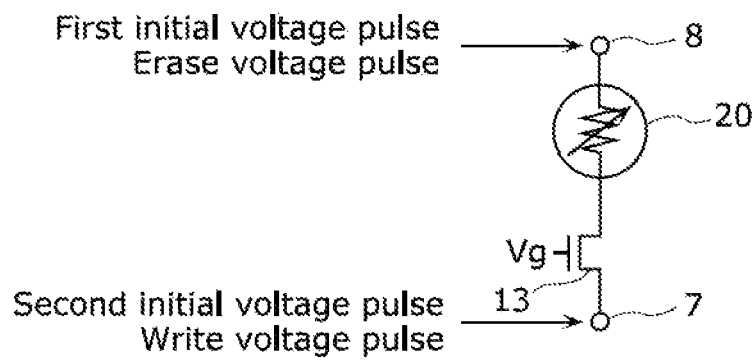
FIG. 3 is a schematic view showing an example configuration of a circuit that operates the variable resistance element according to Embodiment 1.

FIG. 3 shows an example configuration of a circuit that operates variable resistance element 20 and an example operation of writing data in this variable resistance element 20.

As shown in FIG. 3, this circuit includes variable resistance element 20 and first and second terminals 7 and 8. Second electrode 4 of variable resistance element 20 shown in FIG. 1B is electrically connected to second terminal 8, and first electrode 2 is electrically connected to first terminal 7.

In variable resistance element 20, transistor 13 is interposed between first electrode 2 and first terminal 7. This transistor serves as a protective resistor and a switching element for selecting variable resistance element 20. Once gate voltage Vg is applied to this transistor 13, a predetermined voltage pulse is supplied to variable resistance element 20 via transistor 13.

Figure 4:
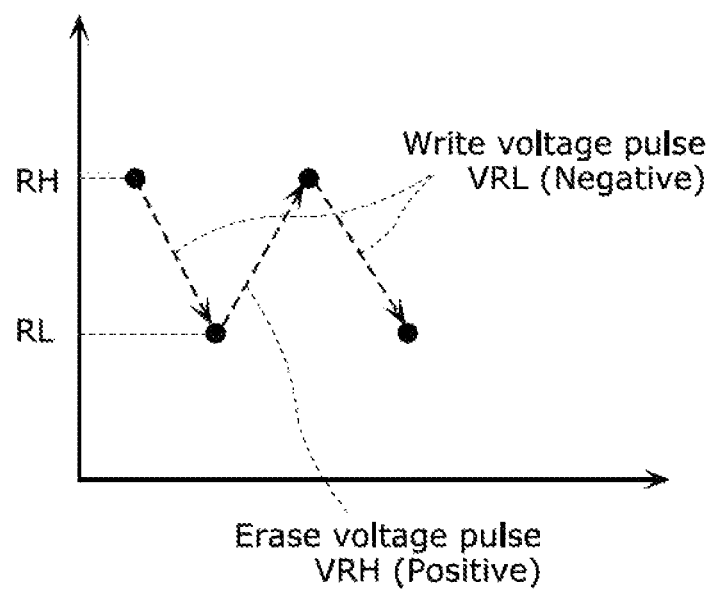
FIG. 4 is a schematic view showing a variation in the resistance value of a variable resistance layer according to Embodiment 1.

FIG. 4 is a schematic view showing variations in the resistance value of variable resistance layer 3 in the write and erase processes of variable resistance element 20. The write process is a resistance decreasing process of writing logical value 0 in variable resistance element 20. The erase process is a resistance increasing process of writing logical value 1 in variable resistance element 20. Note that the resistance decreasing and increasing processes, the following voltage pulses are supplied as shown in FIG. 3. When a voltage pulse with the positive polarity is applied, a predetermined positive voltage pulse is supplied to second terminal 8 relative to first terminal 7. When a voltage pulse with the negative polarity is applied, a predetermined positive voltage pulse is supplied to first terminal 7 relative to second terminal 8.

If variable resistance layer 3 of variable resistance element 20 is in a high-resistance state at a time, a resistance decreasing voltage pulse (e.g., a second voltage pulse with voltage value VRL) with the negative polarity is supplied to second terminal 8. Then, the resistance value of variable resistance layer 3 changes from high resistance value RH to low resistance value RL. On the other hand, assume that the resistance value of variable resistance layer 3 has low resistance value RL. In this state, once a resistance increasing voltage pulse (e.g., a first voltage pulse with voltage value VRH) with the positive polarity is supplied to second terminal 8. Then, the resistance value of variable resistance layer 3 changes from low resistance value RL to resistance value RH.

Figure 5:
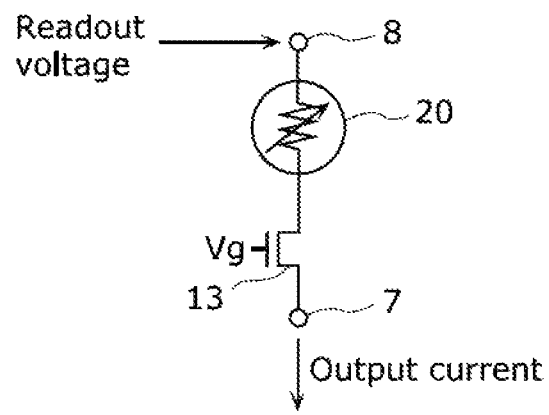
FIG. 5 is a schematic view showing an example configuration of a circuit that operates the variable resistance element according to Embodiment 1.

FIG. 5 shows an example configuration of a circuit that operates variable resistance element 20 and an example operation of reading out the data written in this variable resistance element 20.

As shown in FIG. 5, in order to read out the data, a readout voltage is supplied to second terminal 8 with reference to first terminal 7. This readout voltage has a value causing no resistance even supplied to variable resistance element 20 and specified with reference to first electrode 2 and the ground point.

Mechanism of Improving Data Retention Properties Through Employment of Material with Smaller Oxygen Diffusion Coefficient Here, an assumable mechanism why data retention properties improve using composite oxide layer 3d with a smaller oxygen diffusion coefficient in variable resistance element 20 in place of second tantalum oxide layer 3b in variable resistance element 10. However, the mechanism of improving the data retention properties described above has not drawn a definitive conclusion and only the possibilities will thus be described.

Figure 6A:
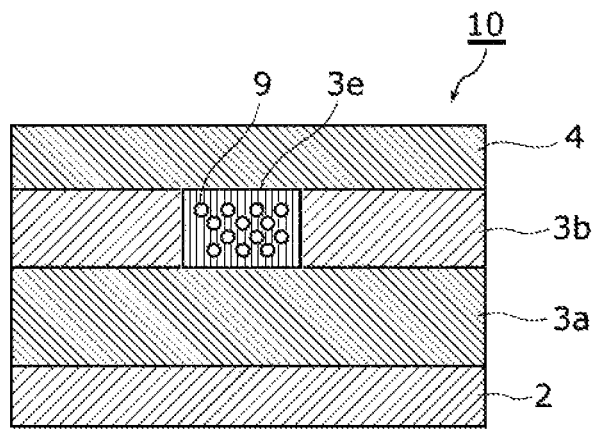
FIG. 6A is a schematic cross-sectional view of the variable resistance element according to the related art in a low-resistance state.
Figure 6B:
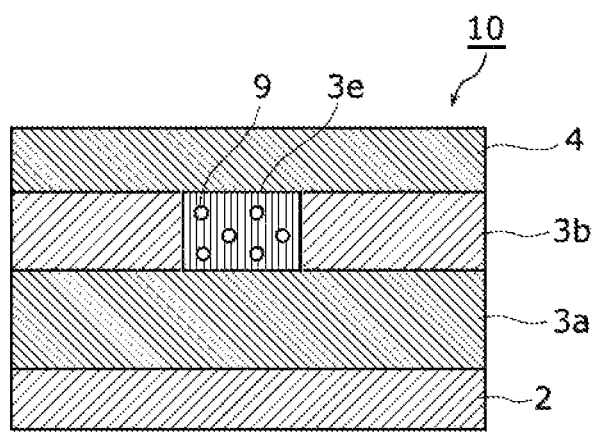
FIG. 6B is a schematic cross-sectional view of the variable resistance element according to the related art in a high-resistance state.

First, the difference between the high- and low-resistance states of the variable resistance element will be described. FIGS. 6A and 6B are schematic cross-sectional views of variable resistance element 10 in the low- and high-resistance states, respectively.

Variable resistance element 10 has a lower resistance value in each of the low- and high-resistance states than in the initial state. In each resistance state, filament 3e connecting upper electrode 4 to tantalum oxide layer 3a is considered to exist within tantalum oxide layer 3b.

The resistance value of variable resistance element 10 is determined by the amount of oxygen deficit 9 in this filament 3e. Oxygen content $NLO_x$ within filament 3e of variable resistance element 10 in the low-resistance state and oxygen content $NHO_x$ within filament 3e of variable resistance element 10 in the high-resistance state are considered to satisfy $NLO_x<NHO_x$. This also applies to variable resistance element 20.

The relation between oxygen deficit 9 within filament 3e and the resistance values of variable resistance elements 10 and 20 will be described more microscopically. Within filament 3e, a tiny conductive path of continuous oxygen deficits exists. In the low-resistance state, there is a sufficient amount of oxygen deficit 9, this tiny conductive path is thus considered to be continuous from upper electrode 2 to tantalum oxide 3a. On the other hand, in the high-resistance state, there is only a small amount of oxygen deficit 9, this tiny conductive path is thus considered to be intermittent.

Based on the resistance changing mechanism described above, the following is considered. The change from the low-resistance state to the high-resistance state while data is retained after the change in the resistance corresponds to the intermittent tiny conductive path. This is because the tiny conductive path is connected weakly within filament 3e so that surrounding oxygen is diffused to the tiny conductive path and connected to certain oxygen deficit 9.

Figure 6C:
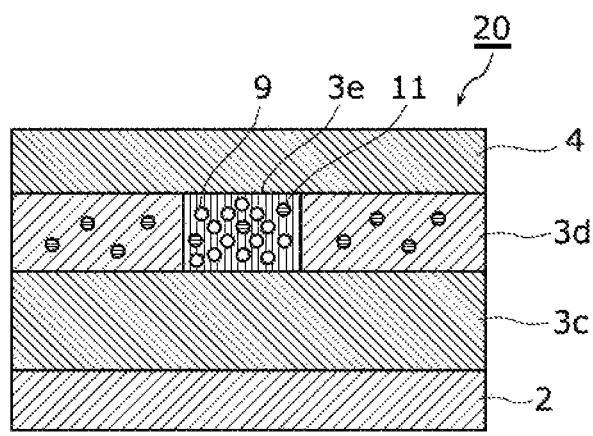
FIG. 6C is a schematic cross-sectional view of the variable resistance element according to Embodiment 1 in a low-resistance state.

By contrast, as shown in FIG. 6C, variable resistance element uses, as a layer within filament 3e, composite oxide layer 3d containing additional metal element 11 different from Ta, and having an oxygen diffusion coefficient smaller than that of tantalum oxide layer 3b. Accordingly, while data is retained, less oxygen is diffused than in the related art, which reduces the surrounding oxygen diffused to the tiny conductive path and connected to oxygen deficit 9. As a result, data is considered to be retained for a longer term than in the related art, particularly in the low-resistance state.

On the other hand, the change from the high-resistance state to the low-resistance state while data is retained after the change in the resistance corresponds to the connected tiny conductive path. This is because the tiny conductive path is intermittent within filament 3e. However, if there are a number of oxygen deficits, the oxygen diffusion causes new oxygen deficits which are connected to the existing oxygen deficits, whereby the intermittent tiny conductive path is connected.

Figure 6D:
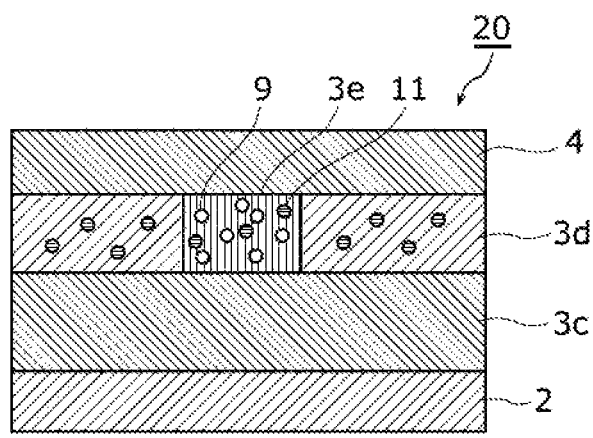
FIG. 6D is a schematic cross-sectional view of the variable resistance element according to Embodiment 1 in a high-resistance state.

By contrast, as shown in FIG. 6D, variable resistance element uses, as a layer within filament 3e, composite oxide layer 3d containing additional metal element 11 different from Ta, and having an oxygen diffusion coefficient smaller than that of tantalum oxide layer 3b. Accordingly, while data is retained, less oxygen is diffused than in the related art, which reduces the connection of the tiny conductive path due to the oxygen diffusion within filament 3e in the high-resistance state. As a result, data is considered to be retained for a longer term than in the related art, particularly in the high-resistance state.

An example has been described above in this embodiment where variable resistance element 20 includes the first variable resistance layer that includes tantalum oxide, and the second variable resistance layer that includes the composite oxide obtained by adding an additional metal element different from Ta to tantalum oxide. The configuration is not limited to this example. The variable resistance element may include the first variable resistance layer that includes an oxide of metal other than Ta, and the second variable resistance layer that includes a composite oxide obtained by adding an additional metal element to the oxide of metal other than Ta. The same explanation also applies to such the variable resistance element, as long as satisfying the magnitude relation of the oxygen diffusion coefficients.

Example of Composite Oxide

The present inventors have studied advantageous additional metal elements in the composite oxide used for the second variable resistance layer according to this embodiment. The explanation follows.

In this example, advantageous materials for the composite oxide have been studied using computer simulation. Specifically, the following additional metal elements have been extracted which are different from Ta. If each of the additional metal elements is added to tantalum oxide to obtain a composite oxide, the resultant composite oxide has an oxygen diffusion coefficient smaller than that of tantalum oxide. In the following description, tantalum will be referred to as the "first metal element" and the additional metal element as the "second metal element".

Note that the diffusion coefficient of a filament has been calculated as follows through the computer simulation which will be described. The filament is a local area generated within composite oxide layer 3d through the initial process in the operation of variable resistance element 20 and having a high degree of oxygen deficiency. Based on the past analysis result, the calculation was performed with a degree of oxygen deficiency of 20%.

First, the oxygen diffusion coefficients of the composite oxides were calculated as follows.

The metal oxides and composite oxides used for the simulation were set using Ta as the first metal element and a metal element selected from Al, hafnium (Hf), vanadium (V), and silicon (Si) as the second metal element. Specifically, five types of: tantalum oxide containing no second metal element; tantalum-aluminum composite oxide; tantalum-hafnium composite oxide; tantalum-silicon composite oxide; and tantalum-vanadium composite oxide were set. The tantalum oxide containing no second metal element is a comparative example to be compared to the composite oxides, and corresponds to the material of the second variable resistance layer according to the related art. Tantalum oxide as the comparative example is referred to as the "second metal oxide" to be distinguished from tantalum oxide as the "first metal oxide" of the first variable resistance layer.

Table 1 shows the compositions of the five types of metal/composite oxides used for the simulation. The numbers of atoms for the simulation were set so that tantalum oxide corresponding to the variable resistance element according to the related art contains 54 tantalum elements. Note that a larger number of atoms allows a more accurate simulation which requires, however, a huge amount of time. The values were thus set as described above. However, the simulation is not necessarily performed with the numbers of atoms described above. Simulations with other numbers of atoms may provide results similar to that of this time.

TABLE 1

| | Bulk Modulus $G_0$ (Gpa) | Diffusion Coefficient at RT ($10^{-8}$ cm$^2$/s) | Melting Point (° C.) |
| --- | --- | --- | --- |
| $Ta_{54}O_{108}$ | 46 | $1.5 \times 10^{-12}$ | $Ta_2O_5$: 1468 |
| $Al_{20}Ta_{42}O_{108}$ | 53 | $1.9 \times 10^{-14}$ | $Al_2O_3$: 2015 |
| $Hf_{15}Ta_{42}O_{108}$ | 55 | $1.2 \times 10^{-13}$ | $HfO_2$: 2810 |
| $V_{12}Ta_{42}O_{108}$ | 48 | $4.4 \times 10^{-12}$ | $V_2O_5$: 690 |
| $Si_{15}Ta_{42}O_{108}$ | 21 | $2.1 \times 10^{-11}$ | $SiO_2$: 1710 |

In the variable resistance element according to this embodiment, filament 3e is formed within variable resistance layer 3 through the initial process described above. In filament 3e, tantalum oxide is assumed to have a degree of oxygen deficiency of about 20% according to the past quantitative analysis.

Thus, in the simulation, the compositions of the five types of metal/composite oxides were set to have the degree of oxygen deficiency of 20%. Tantalum oxide with the degree of oxygen deficiency of 20% has the composition $Ta_{54}O_{108}$. In the composite oxide containing tantalum and the second metal element, 12 tantalum atoms, which account for about 22% of 54 tantalum atoms (i.e., 24 oxygen atoms in tantalum oxide with the degree of oxygen deficiency of 20%) were replaced with the second metal element. The atom number of the replacing second metal element and 24 oxygen atoms form a metal oxide with the degree of oxygen deficiency of 20%. Accordingly, the composite oxide as a whole has the degree of oxygen deficiency of 20%.

Accordingly, for example, tantalum-aluminum composite oxide has the composition $(Ta_{42}O_{84})$—$(Al_{20}O_{24})$. This also applies to the other composite oxides. While the simulation was performed here with $(Ta_{42}O_{84})$, simulations with different compositions may provide results similar to that of this time. In the calculation of this time, the degree of oxygen deficiency was set to 20% but may not be necessarily 20%. As long as an equal degree of oxygen deficiency is set among the metal oxides, results similar to that of this time may be provided.

An effective percentage of the tantalum atoms to be replaced with the second metal element will be considered later in detail.

With respect to the five types of metal/composite oxides set in this manner, the most stable structure at 4000 K was obtained using the first-principles calculation based on the Birch-Murnaghan isothermal equation of state. Specifically, the structure was obtained which had the minimum internal energy as the index of a stable structure. By the calculation, the bulk modulus of the most stable structure was calculated.

The bulk modulus is defined by the curvature of the sum of the Helmholtz free energy, that is, the internal energy and the entropy. In this simulation, the value of the bulk modulus was calculated where the Helmholtz free energy was approximate to the internal energy. Simulations where the Helmholtz free energy is not necessarily equal to the internal energy may provide, as the magnitude relations of the bulk moduli, results similar to that of this time.

Next, in the most stable structure, the movements of oxygen atoms for 50 picoseconds were simulated. The total travel distances of the oxygen atoms were calculated to obtain the average. Accordingly, the oxygen diffusion coefficients inside the metal oxides were calculated at 4000 K.

Further, at 3000 K as well, a simulation was performed with respect to the movements of oxygen atoms for 130 picoseconds or more. Accordingly, the oxygen diffusion coefficients inside the metal oxides were calculated at 3000 K.

In the end, from the values of the oxygen diffusion coefficients inside the metal oxides at 4000 K and 3000 K, the values of the oxygen diffusion coefficients at 300 K, which corresponds to room temperature, were calculated based on the Arrhenius equation.

The simulation results calculated in this manner are shown in Table 1. As can be seen from Table 1, the two metal oxides of tantalum-aluminum composite oxide and tantalum-hafnium composite oxide have oxygen diffusion coefficients smaller than that of tantalum oxide. On the other hand, the two metal oxides of tantalum-aluminum composite oxide and tantalum-hafnium composite oxide have bulk moduli larger than that of tantalum oxide.

Here, each bulk modulus is the reciprocal of the percentage of the volume change at the time of applying a constant pressure. In general, a material with a great bulk modulus is said to be highly resistant to strain or rigid.

From this point of view, the simulation results described above can be construed as follows. Specifically, tantalum-aluminum composite oxide and tantalum-hafnium composite oxide with larger bulk moduli have firmly connected networks, which are less subjected to the phenomenon that oxygen atoms leave the networks so as to be diffused than tantalum oxide.

In addition, the bulk modulus of each composite oxide is compared to the melting point of an oxide containing the second metal element of the composite oxide and oxygen, and having the stoichiometric composition. There is a positive correlation in the four composite oxides calculated this time except for tantalum-silicon composite oxide.

Among the composite oxides studied at this time, only tantalum-silicon composite oxide contains silicon that is semiconductor, and the silicon oxide as a covalent oxide. The composite oxide has a high melting point but a small bulk modulus, which less contributes to a decrease in the diffusion coefficient. In view of this, the following is assumed. A general metal element forming an ionic oxide is used as the second metal element. A metal oxide containing the second metal element and oxygen, and having a high melting point is mixed to tantalum oxide to obtain a composite oxide. The composite oxide has then a larger bulk modulus, which results in a smaller oxygen diffusion coefficient.

Base on this idea, the second metal element of the composite oxide according to this embodiment can be selected from the group consisting of zinc (Zn), titanium (Ti), gallium (Ga), nickel (Ni), Al, yttrium (Y), zirconium (Zr), magnesium (Mg), and Hf whose oxide has a melting point higher than that of tantalum oxide.

However, there may be other additional causes, which are not considered this time, for the phenomenon of reducing the oxygen diffusion coefficient. All metal elements whose oxides have melting points higher than that of tantalum oxide do not automatically have larger bulk moduli. Also, the composite metals with larger bulk moduli than that of tantalum oxide do not automatically have smaller oxygen diffusion coefficients.

Based on results of the simulation through the first-principles calculation as described above, the decreases in the oxygen diffusion coefficients of tantalum-aluminum composite oxide and tantalum-hafnium composite oxide are acknowledged. In this example, variable resistance elements including these composite oxides were prepared by the methods of manufacturing and operating the variable resistance element according to this embodiment and operated actually.

Figure 7A:
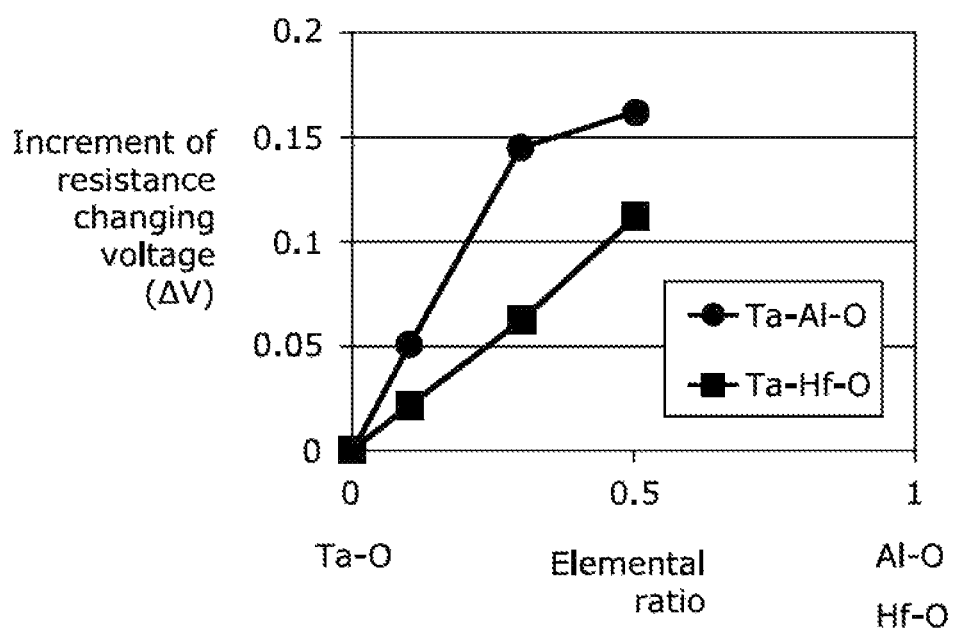
FIG. 7A shows results of evaluation on resistance changing voltages according to Embodiment 1.

FIG. 7A shows the dependency of the resistance changing voltage of each variable resistance element on the element composition. Each variable resistance element includes the second variable resistance layer that includes tantalum-aluminum composite oxide or tantalum-hafnium composite oxide. Here, applied to the variable resistance element, each resistance changing voltage changes the resistance. The elemental ratio of the horizontal axis represents the composition ratio of the second metal element contained in the composite oxide of the second variable resistance layer to the sum of the first and second metal elements. Here, the first metal element is Ta, whereas the second metal element is Al or Hf. The composition ratio of 0 represents the oxide containing neither Al nor Hf but only Ta.

It is found from FIG. 7A that each resistance changing voltage is increased by adding Al or Hf to tantalum oxide.

The phenomenon of chaining the resistance of the variable resistance element corresponds to a change in the amount of oxygen deficit 9 within filament 3e by the electrical energy that moves oxygen ions. There is considered to be a need to apply a higher voltage to variable resistance layer 3 with a smaller oxygen diffusion coefficient.

That is, the result of FIG. 7A is considered to experimentally show that the oxygen diffusion coefficient is reduced by adding Al or Hf to tantalum oxide.

However, on the other hand, with a higher capacity of a non-volatile memory, a decrease in the operating voltage is required. There is thus a demand for limiting the increase in the voltage applied to tantalum oxide to about 0.2 V or less. In view of this, a tendency was predicted from the result of the dependency of each resistance changing voltage on the element composition. As a result, the composition rate of the second metal element contained in the composite oxide may range, for example, from 10% to 50% with respect to the sum of the first and second metal elements.

In this example, the data retention properties of the variable resistance element group were evaluated where the second variable resistance layer of each variable resistance element according to this embodiment included tantalum oxide, tantalum-aluminum composite oxide, or tantalum-hafnium composite oxide.

Here, the conditions of the resistance changing operation performed in this example will be described specifically. In the normal resistance changing operation, a write voltage pulse was set to have a pulse voltage with the negative polarity so that a current of 150 µA flowed through each variable resistance element at the time of application. The pulse was applied for 100 ns. On the other hand, an erase voltage pulse was set to have a pulse voltage of +1.8 V and applied for 100 ns. In this example, after performing the initial process described above, the normal resistance changing operation was repeated 1000 times under the conditions described above.

As described above, the retention properties of the resistance values of the prepared variable resistance element group were evaluated. Note that the resistance values of the variable resistance elements used in this example hardly deteriorate over ten years at a temperature around room temperature. Thus, while the non-volatile memory elements were kept in a constant-temperature bath at a temperature of 210° C. to accelerate the deterioration. In this state, the retention properties were evaluated. Note that the resistance values were measured at room temperature after taking out the non-volatile memory elements from the constant-temperature bath.

Figure 7B:
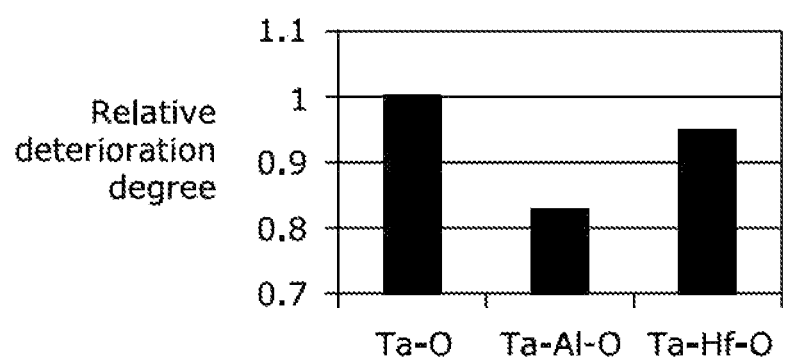
FIG. 7B shows results of evaluation on data retention properties according to Embodiment 1.

FIG. 7B shows relative deterioration degrees of the retention properties of the variable resistance element groups according to a comparative example and an example. In the comparative example, the variable resistance element includes the second variable resistance layer that includes tantalum oxide. In the example, each variable resistance element includes the second variable resistance layer that includes tantalum-aluminum composite oxide or tantalum-hafnium composite oxide. FIG. 7B shows, as an example relative deterioration degree of the retention properties, the decreasing rate of each readout current caused by an increase in the resistance value in the low resistance state. The decreasing rate in the variable resistance element group according to the comparative example is assumed to be 1.

As can be seen from FIG. 7B, the variable resistance element group each including the second variable resistance layer that includes tantalum-aluminum composite oxide or tantalum-hafnium composite oxide has a relative deterioration degree (i.e., decreasing rate of the readout current) smaller than that of the variable resistance element group including the second variable resistance layer that includes tantalum oxide. That is, it is found that the resistance value less increases and the retention properties improve in the low resistance state.

It is clear from above, using the variable resistance element according to this embodiment, information is stably stored for a long term as compared to related art.

Embodiment 2

Used in Embodiment 2 is a non-volatile memory device of a one-transistor one-non-volatile memory (1T1R) type including the variable resistance element described above in Embodiment 1. Now, a configuration and an operation of this non-volatile memory device will be described.

Figure 8:
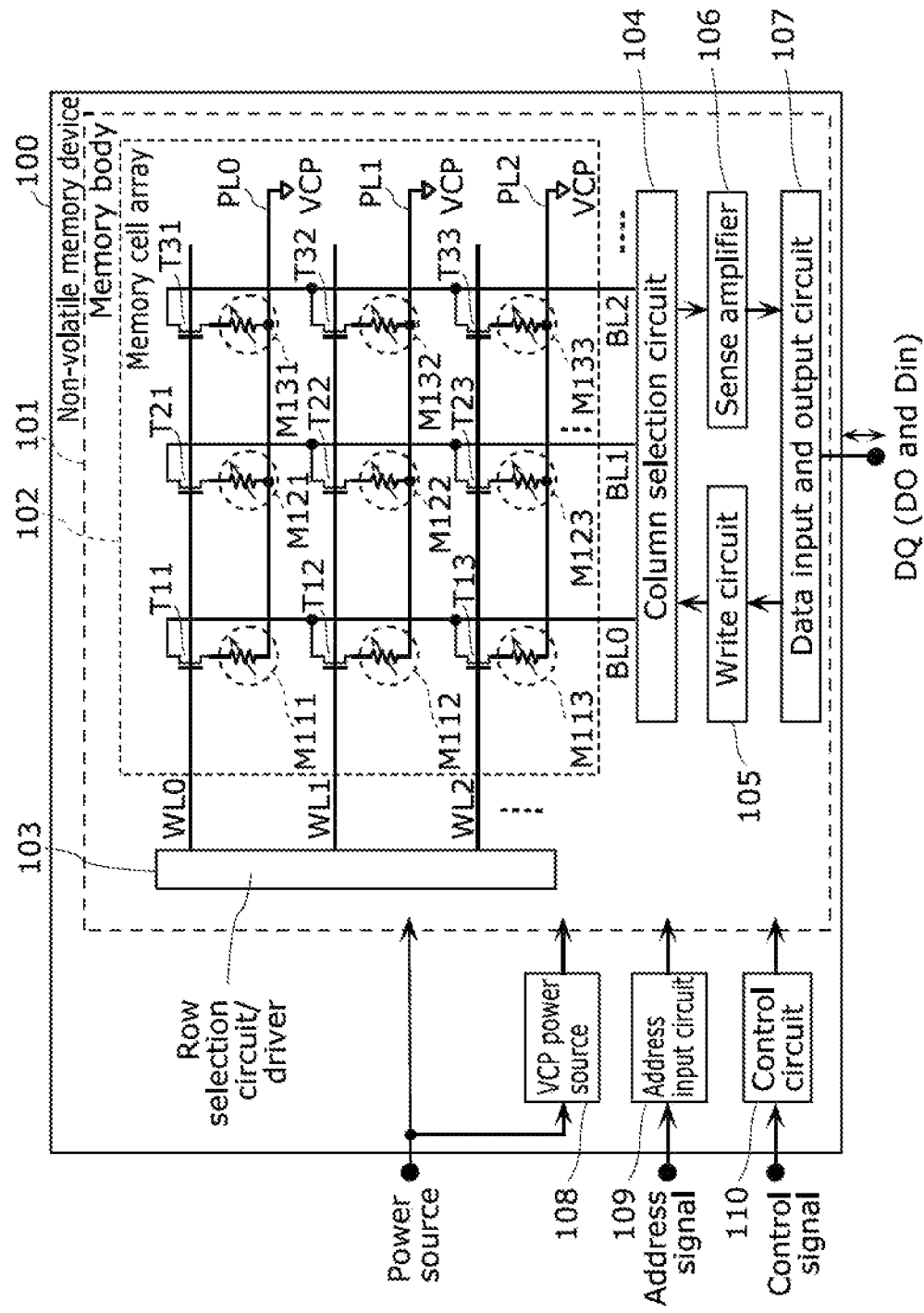
FIG. 8 is a block diagram showing an example configuration of a non-volatile memory device according to Embodiment 2.

FIG. 8 is a block diagram showing an example configuration of the non-volatile memory device according to Embodiment 2.

As shown in FIG. 8, 1T1R non-volatile memory device 100 according to this embodiment includes memory body 101 on a semiconductor substrate. Memory body 101 includes memory cell array 102 equipped with variable resistance elements and access transistors, and a voltage application circuit. Here, each access transistor is an example of the "current control element".

The voltage application circuit includes, for example, row selection circuit/driver 103, column selection circuit 104, write circuit 105, sense amplifier 106, and data input and output circuit 107.

Write circuit 105 controls the application of voltages to the memory cells in the initial process as well as the data writing and reading processes. Sense amplifier 106 detects the amount of the current flowing through each selected bit line to determine which of the binary data is stored. Data input and output circuit 107 performs the processing of inputting and outputting data via terminal DQ.

Non-volatile memory device 100 further includes cell plate (VCP) power source 108, address input circuit 109, and control circuit 110. Address input circuit 109 receives the address signals input from the outside. Control circuit 110 controls the operation of memory body 101 based on the control signals input from the outside.

Memory cell array 102 includes a plurality of word lines WL0, WL1, WL2, . . . and bit lines BL0, BL1, BL2, . . . intersecting on the semiconductor substrate. Memory cell array 102 also includes a plurality of access transistors T11, T12, T13, T21, T22, T23, T31, T32, T33, . . . and a plurality of memory cells M111, M112, M113, M121, M122, M123, M131, M132, M133 (hereinafter referred to as "memory cells M111, M112, . . . "). Access transistors T11, T12, . . . are located at the intersections between word lines WL0, WL1, WL2, . . . and bit lines BL0, BL1, BL2, . . . . Memory cells M111, M112, . . . are in one-to-one correspondence with access transistors T11, T12, . . . . Here, each of memory cells M111, M112, . . . corresponds to variable resistance element 20 according to Embodiment 1.

Memory cell array 102 further includes a plurality of plate lines PL0, PL1, PL2, . . . in parallel with word lines WL0, WL1, WL2, . . . .

The drains of access transistors T11, T12, T13, . . . are connected to bit line BL0. The drains of access transistors T21, T22, T23, . . . are connected to bit line BL1. The drains of access transistors T31, T32, T33, . . . are connected to bit line BL2.

The gates of access transistors T11, T21, T31, . . . are connected to word line WL0. The gates of access transistors T12, T22, T32, . . . are connected to word line WL1. The gates of access transistors T13, T23, T33, . . . are connected to word line WL2.

The sources of access transistors T11, T12, . . . are connected to memory cells M111, M112, . . . , respectively.

Memory cells M111, M121, M131, . . . are connected to plate line PL0. Memory cells M112, M122, M132, . . . are connected to plate line PL1. Memory cells M113, M123, M133, . . . are connected to plate line PL2.

In non-volatile memory device 100 with such a configuration, address input circuit 109 receives the address signals from an external circuit (not shown). Based on these address signals, address input circuit 109 then outputs row address signals to row selection circuit/driver 103 and column address signals to column selection circuit 104.

Here, each address signal indicates the address of a specific memory cell selected out of the plurality of memory cells M111, M112, . . . . Each row address signal indicates the row address of the address indicated by the associated one of the address signals, whereas each column address signal indicates the column address of the address indicated by the address signal.

In the initial process, control circuit 110 outputs, to write circuit 105, a write signal for instructing application of first and second initial voltage pulses to memory cells M111, M112, . . . in this order. Receiving this write signal, write circuit 105 outputs, to column selection circuit 104, a signal for instructing application of the first and second initial voltage pulses to all bit lines BL0, BL1, BL2, . . . .

Receiving this signal, column selection circuit 104 applies the first and second initial voltage pulses to all bit lines BL0, BL1, BL2, . . . . At this time, row selection circuit/driver 103 applies a predetermined voltage to each of word lines WL0, WL1, WL2, . . . .

Through the operation described above, the initial process is completed.

After that, in a data writing process, control circuit 110 outputs, to write circuit 105, a write signal for instructing application of a write voltage pulse or an erase voltage pulse in accordance with input data Din input to data input and output circuit 107. On the other hand, in a data reading process, control circuit 110 outputs, to column selection circuit 104, a readout signal for instructing application of a readout voltage pulse.

Row selection circuit/driver 103 receives the row address signal output from address input circuit 109, selects any of the plurality of word lines WL0, WL1, WL2, . . . in accordance with this row address signal, and applies a predetermined voltage to the selected word line.

Column selection circuit 104 receives the column address signal output from address input circuit 109, selects any of the plurality of bit lines BL0, BL1, BL2, . . . in accordance with this column address signal, and applies a write voltage pulse, an erase voltage pulse, or a readout voltage pulse to the selected bit line.

Receiving a write signal output from control circuit 110, write circuit 105 outputs, to column selection circuit 104, a signal instructing application of a write voltage pulse or an erase voltage pulse to the selected bit line.

In the data reading process, sense amplifier 106 detects the amount of the current flowing through the selected bit line to be read out, to determine the stored data. In this embodiment, each of memory cells M111, M112, . . . is in one of two resistance states, namely, a high or low resistance state which is associated with data. Thus, sense amplifier 106 determines the resistance state of the variable resistance layer of the selected memory cell and, accordingly, determines which of the binary data is stored. Resultant output data DO is output to an external circuit via data input and output circuit 107.

Non-volatile memory device 100 uses memory cells M111, M112, . . . , each of which corresponds to variable resistance element according to Embodiment 1, and thus stably stores information for a long term.

Embodiment 3

Used in Embodiment 3 is a cross-point non-volatile memory device including the variable resistance element described above in Embodiment 1. Now, a configuration and an operation of this non-volatile memory device will be described.

Figure 9:
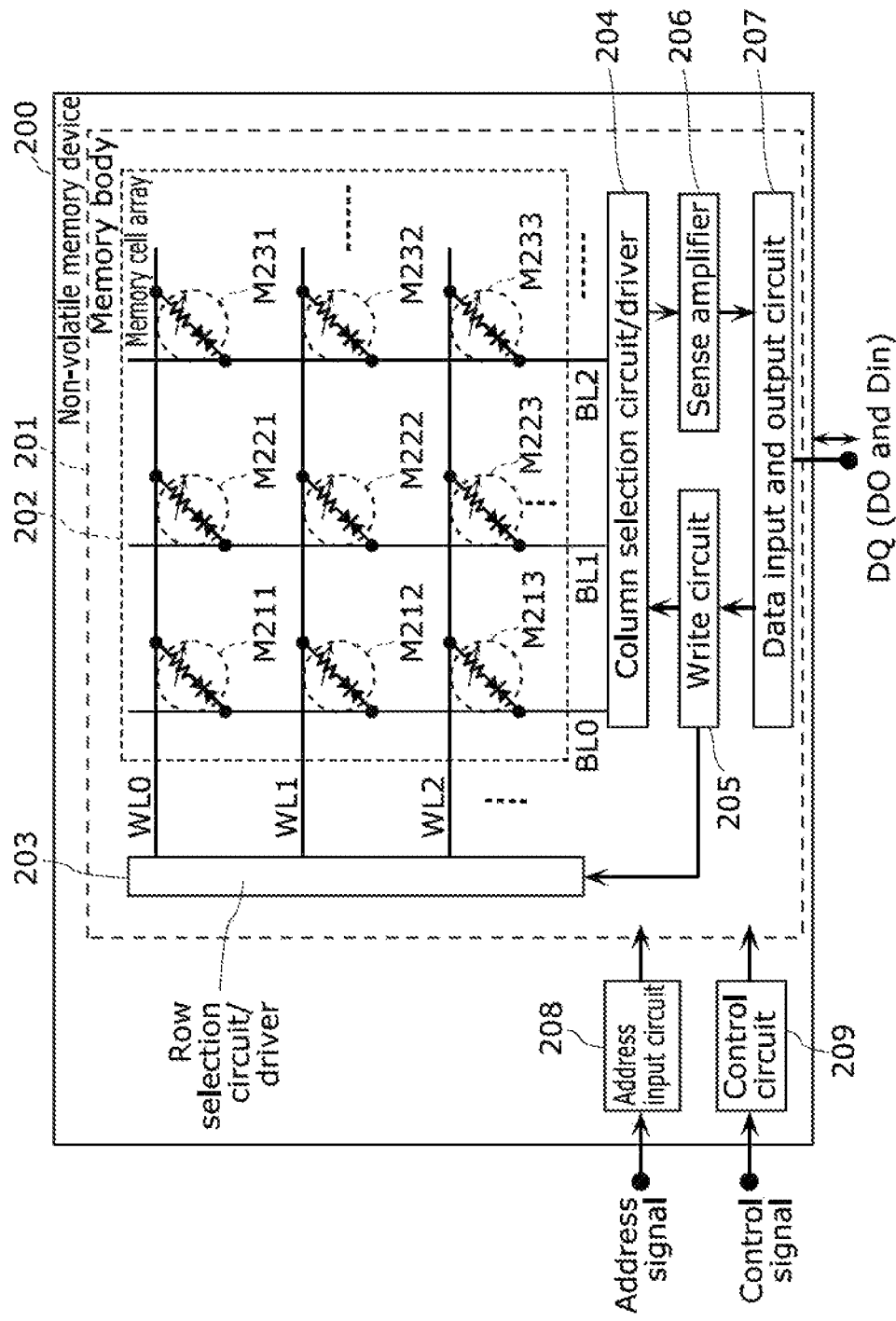
FIG. 9 is a block diagram showing an example configuration of a non-volatile memory device according to Embodiment 3.

FIG. 9 is a block diagram showing an example configuration of the non-volatile memory device according to Embodiment 3.

As shown in FIG. 9, non-volatile memory device 200 according to this embodiment includes memory body 201 on a semiconductor substrate. Memory body 201 includes memory cell array 202, row selection circuit/driver 203, column selection circuit/driver 204, write circuit 205, sense amplifier 206, and data input and output circuit 207.

Write circuit 205 controls the application of voltages to the memory cells in the initial process as well as the data writing and reading processes. Sense amplifier 206 detects the amount of the current flowing through each selected bit line to determine which of the binary data is stored. Data input and output circuit 207 performs the processing of inputting and outputting data via terminal DQ.

Non-volatile memory device 200 further includes address input circuit 208 and control circuit 209. Address input circuit 208 receives the address signals input from the outside. Control circuit 209 controls the operation of memory body 201 based on the control signals input from the outside.

Memory array 202 includes a plurality of word lines WL0, WL1, WL2, . . . and a plurality of bit lines BL0, BL1, BL2, . . . above these word lines WL0, WL1, WL2, . . . . Word lines WL0, WL1, WL2, . . . are parallel to each other on the semiconductor substrate. Bit lines BL0, BL1, BL2, . . . are parallel to each other on the plane parallel to the main surface of the semiconductor substrate, and intersect the plurality of word lines WL0, WL1, WL2, . . . by grade separation.

A plurality of memory cells M211, M212, M213, M221, M222, M223, M231, M232, M233 . . . are arranged in a matrix to correspond to the intersections between word lines WL0, WL1, WL2, . . . and bit lines BL0, BL1, BL2, . . . . Here, each of memory cells M211, M212, . . . is obtained by connecting an element corresponding to variable resistance element 20 according to Embodiment 1 to a current control element which is a metal-insulator-metal (MIM) diode or a metal-semiconductor-metal (MSM) diode.

In non-volatile memory device 200 with such a configuration, address input circuit 208 receives the address signals from an external circuit (not shown). Based on these address signals, address input circuit 208 outputs row address signals to row selection circuit/driver 203 and column address signals to column selection circuit/driver 204. Here, each address signal indicates the address of a specific memory cell selected out of the plurality of memory cells M211, M212, . . . . Each row address signal indicates the row address of the address indicated by the associated one of the address signals, whereas each column address signal indicates the column address of the address indicated by the address signal.

In the initial process, control circuit 209 outputs, to write circuit 205, a write signal for instructing application of the first and second initial voltage pulses to memory cells M211, M212, . . . in this order. Receiving this write signal, write circuit 205 outputs, to row selection circuit/driver 203, a signal for instructing application of a predetermined voltage to each of word lines WL0, WL1, WL2, . . . , and outputs, to column selection circuit/driver 204, a signal for instructing application of the first and second initial voltage pulses to all bit lines BL0, BL1, BL2, . . . .

Through the operation described above, the initial process is completed.

After that, in a data writing process, control circuit 209 outputs, to write circuit 205, a write signal for instructing application of a write voltage pulse or an erase voltage pulse in accordance with input data Din input to data input and output circuit 207. On the other hand, in a data reading process, control circuit 209 outputs, to column selection circuit/driver 204, a readout signal for instructing application of a readout voltage pulse.

Row selection circuit/driver 203 receives a row address signal output from address input circuit 208, selects any of the plurality of word lines WL0, WL1, WL2, . . . in accordance with this row address signal, and applies a predetermined voltage to the selected word line.

Column selection circuit/driver 204 receives a column address output from address input circuit 208, selects any of the plurality of bit lines BL0, BL1, BL2, . . . in accordance with this column address signal, and applies a write voltage pulse, an erase voltage pulse, or a readout voltage pulse to the selected bit line.

Receiving a write signal output from control circuit 209, write circuit 205 then outputs, to row selection circuit/driver 203, a signal instructing application of a voltage to the selected word line; and, to column selection circuit/driver 204, a signal instructing application of a write voltage pulse or an erase voltage pulse to the selected bit line.

In the data reading process, sense amplifier 206 detects the amount of the current flowing through the selected bit line to be read out, to determine the stored data. In this embodiment, each of memory cells M211, M212, . . . is in one of two resistance states, namely, a high or low resistance state which is associated with data. Thus, sense amplifier 206 determines the resistance state of the variable resistance layer of the selected memory cell and, accordingly, determines which of the binary data is stored. Resultant output data DO is output to an external circuit via data input and output circuit 207.

Non-volatile memory device 200 uses memory cells M211, M212, . . . , each of which includes an element corresponding to variable resistance element 20 according to Embodiment 1, and thus stably stores information for a long term.

A non-volatile memory device with a multilayer structure may be achieved by a three-dimensionally stacked memory array of the non-volatile memory device according to this embodiment shown in FIG. 9. The multilayer memory array with this configuration achieves a super high-capacity non-volatile memory device.

CONCLUSION

As described above, the variable resistance non-volatile memory element according to the present disclosure includes: a first electrode; a second electrode; and a variable resistance layer between the first electrode and the second electrode, the variable resistance layer having a resistance value reversibly variable based on an electrical signal applied between the first electrode and the second electrode. The variable resistance layer includes: a first variable resistance layer that includes a first metal oxide of an oxygen-deficient type, the first metal oxide containing a first metal element and oxygen; and a second variable resistance layer that includes a composite oxide containing the first metal element, a second metal element different from the first metal element, and oxygen, and having a degree of oxygen deficiency different from a degree of oxygen deficiency of the first metal oxide. The degree of oxygen deficiency of the composite oxide is lower than the degree of oxygen deficiency of the first metal oxide. The composite oxide has, at room temperature, an oxygen diffusion coefficient smaller than an oxygen diffusion coefficient, at the room temperature, of a second metal oxide containing the first metal element and oxygen, and having a degree of oxygen deficiency equal to the degree of oxygen deficiency of the composite oxide.

In the variable resistance non-volatile memory element according to the present disclosure, the composite oxide may have a bulk modulus larger than a bulk modulus of the second metal oxide.

In the variable resistance non-volatile memory element according to the present disclosure, an oxide of the second metal element with a stoichiometric composition may have a melting point higher than a melting point of an oxide of the first metal element with the stoichiometric composition.

In the variable resistance non-volatile memory element according to the present disclosure, the second metal element may form an ionic oxide.

In the variable resistance non-volatile memory element according to the present disclosure, the composite oxide may have a resistivity higher than a resistivity of the first metal oxide.

In the variable resistance non-volatile memory element according to the present disclosure, the first metal element may be transition metal or aluminum (Al).

In the variable resistance non-volatile memory element according to the present disclosure, the first metal element may be tantalum (Ta).

In the variable resistance non-volatile memory element according to the present disclosure, the second metal element may be any of zinc (Zn), titanium (Ti), gallium (Ga), nickel (Ni), Al, yttrium (Y), zirconium (Zr), magnesium (Mg), or hafnium (Hf).

In the variable resistance non-volatile memory element according to the present disclosure, the second metal element may be Al or Hf.

In the variable resistance non-volatile memory element according to the present disclosure, in the composite oxide, a composition rate of the second metal element may range from 10% to 50% with respect to a sum of the first metal element and the second metal element.

In the variable resistance non-volatile memory element according to the present disclosure, the first variable resistance layer and the second variable resistance layer may be both amorphous.

In the variable resistance non-volatile memory element according to the present disclosure, the second variable resistance layer may be interposed between the second electrode and the first variable resistance layer. The second electrode may include noble metal.

In the variable resistance non-volatile memory element according to the present disclosure, the second variable resistance layer may be interposed between the second electrode and the first variable resistance layer. The second electrode may include transition metal nitride.

In the variable resistance non-volatile memory element according to the present disclosure, the reversible variation in the resistance value based on the electrical signal applied between the first electrode and the second electrode may be attributed to movement of oxygen ions.

In the variable resistance non-volatile memory element according to the present disclosure, the variable resistance layer may include a local area with a higher degree of oxygen deficiency within the second variable resistance layer.

The variable resistance non-volatile memory element according to the present disclosure may further include a current control element electrically connected to the first electrode or the second electrode.

In the variable resistance non-volatile memory element according to the present disclosure, the current control element may be a transistor or a diode.

The variable resistance non-volatile memory device according to the present disclosure includes: a memory cell array on or above a substrate; and a voltage application circuit. The memory cell array includes, in a matrix, a plurality of variable resistance non-volatile memory elements, each being the variable resistance non-volatile memory element described above. The voltage application circuit writes, erases, and reads out data in and from a predetermined one of the plurality of variable resistance non-volatile memory elements.

In the variable resistance non-volatile memory device according to the present disclosure, each of the plurality of variable resistance non-volatile memory elements may further include a current control element electrically connected to the first electrode or the second electrode. The current control element may be a transistor.

In the variable resistance non-volatile memory device according to the present disclosure, each of the plurality of variable resistance non-volatile memory elements may further include a current control element electrically connected to the first electrode or the second electrode. The current control element may be a diode.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The variable resistance non-volatile memory element and the variable resistance non-volatile memory device using the element according to the present disclosure stably store information for a long term. The element and device are particularly useful as a variable resistance non-volatile memory element used for various electronic devices such as data servers or individual information recording media, and a variable resistance non-volatile memory device using the element.

The invention claimed is:

1. A variable resistance non-volatile memory element, comprising:
   a first electrode;
   a second electrode; and
   a variable resistance layer between the first electrode and the second electrode, the variable resistance layer having a resistance value reversibly variable based on an electrical signal applied between the first electrode and the second electrode, wherein
   the variable resistance layer includes:
      a first variable resistance layer that includes a first metal oxide of an oxygen-deficient type, the first metal oxide containing a first metal element and oxygen; and
      a second variable resistance layer that includes a composite oxide containing the first metal element, a second metal element different from the first metal element, and oxygen, the composite oxide having a degree of oxygen deficiency different from a degree of oxygen deficiency of the first metal oxide,
   the degree of oxygen deficiency of the composite oxide is lower than the degree of oxygen deficiency of the first metal oxide,
   the composite oxide has, at room temperature, an oxygen diffusion coefficient smaller than an oxygen diffusion coefficient, at the room temperature, of a second metal oxide containing the first metal element and oxygen, and having a degree of oxygen deficiency equal to the degree of oxygen deficiency of the composite oxide, and
   the first variable resistance layer and the second variable resistance layer are both amorphous.

2. The variable resistance non-volatile memory element according to claim 1, wherein an oxide of the second metal element with a stoichiometric composition has a melting point higher than a melting point of an oxide of the first metal element with the stoichiometric composition.

3. The variable resistance non-volatile memory element according to claim 1, wherein the second metal element forms an ionic oxide.

4. The variable resistance non-volatile memory element according to claim 1, wherein the composite oxide has a resistivity higher than a resistivity of the first metal oxide.

5. The variable resistance non-volatile memory element according to claim 1, wherein the first metal element is transition metal or aluminum (Al).

6. The variable resistance non-volatile memory element according to claim 5, wherein the first metal element is tantalum (Ta).

7. The variable resistance non-volatile memory element according to claim 5, wherein the second metal element is any of zinc (Zn), titanium (Ti), gallium (Ga), nickel (Ni), Al, yttrium (Y), zirconium (Zr), magnesium (Mg), or hafnium (Hf).

8. The variable resistance non-volatile memory element according to claim 7, wherein the second metal element is Al or Hf.

9. The variable resistance non-volatile memory element according to claim 5, wherein in the composite oxide, a composition rate of the second metal element ranges from 10% to 50% with respect to a sum of the first metal element and the second metal element.

10. The variable resistance non-volatile memory element according to claim 1, wherein
the second variable resistance layer is interposed between the second electrode and the first variable resistance layer, and
the second electrode includes noble metal.

11. The variable resistance non-volatile memory element according to claim 1, wherein
the second variable resistance layer is interposed between the second electrode and the first variable resistance layer, and
the second electrode includes transition metal nitride.

12. The variable resistance non-volatile memory element according to claim 1, wherein the reversible variation in the resistance value based on the electrical signal applied between the first electrode and the second electrode is attributed to movement of oxygen ions.

13. The variable resistance non-volatile memory element according to claim 1, wherein the variable resistance layer includes a local area with a higher degree of oxygen deficiency within the second variable resistance layer.

14. The variable resistance non-volatile memory element according to claim 1, further comprising:
a current control element electrically connected to the first electrode or the second electrode.

15. The variable resistance non-volatile memory element according to claim 14, wherein the current control element is a transistor or a diode.

16. A variable resistance non-volatile memory device, comprising:
a memory cell array on or above a substrate; and
a voltage application circuit, wherein
the memory cell array includes, in a matrix, a plurality of variable resistance non-volatile memory elements, each being the variable resistance non-volatile memory element according to claim 1, and
the voltage application circuit writes, erases, and reads out data in and from a predetermined one of the plurality of variable resistance non-volatile memory elements.

17. The variable resistance non-volatile memory device according to claim 16, wherein
each of the plurality of variable resistance non-volatile memory elements further includes a current control element electrically connected to the first electrode or the second electrode, and
the current control element is a transistor.

18. The variable resistance non-volatile memory device according to claim 16, wherein
each of the plurality of variable resistance non-volatile memory elements further includes a current control element electrically connected to the first electrode or the second electrode, and
the current control element is a diode.

19. A variable resistance non-volatile memory element, comprising:
a first electrode;
a second electrode; and
a variable resistance layer between the first electrode and the second electrode, the variable resistance layer having a resistance value reversibly variable based on an electrical signal applied between the first electrode and the second electrode, wherein
the variable resistance layer includes:
a first variable resistance layer that includes a first metal oxide of an oxygen-deficient type, the first metal oxide containing a first metal element and oxygen; and
a second variable resistance layer that includes a composite oxide containing the first metal element, a second metal element different from the first metal element, and oxygen, the composite oxide having a degree of oxygen deficiency different from a degree of oxygen deficiency of the first metal oxide,
the degree of oxygen deficiency of the composite oxide is lower than the degree of oxygen deficiency of the first metal oxide,
the composite oxide has, at room temperature, an oxygen diffusion coefficient smaller than an oxygen diffusion coefficient, at the room temperature, of a second metal oxide containing the first metal element and oxygen, and having a degree of oxygen deficiency equal to the degree of oxygen deficiency of the composite oxide, and
the composite oxide has a bulk modulus larger than a bulk modulus of the second metal oxide.

* * * * *